United States Patent [19]
Chen

[11] Patent Number: 5,528,149
[45] Date of Patent: Jun. 18, 1996

[54] TEST CIRCUIT FOR BACK-UP BATTERY

[75] Inventor: Zhong X. Chen, Shrewsbury, Mass.

[73] Assignee: International Business Machines Corporation, Armonk, N.Y.

[21] Appl. No.: 363,670

[22] Filed: Dec. 23, 1994

[51] Int. Cl.$^6$ ................................................. H01M 10/44
[52] U.S. Cl. ...................... 324/433; 324/427; 324/429; 320/28; 320/29; 320/48
[58] Field of Search .................. 320/21, 28, 19, 320/29, 56, 48; 307/70; 324/433, 427, 429

[56] References Cited

U.S. PATENT DOCUMENTS

| | | |
|---|---|---|
| 4,225,792 | 9/1980 | Fahey . |
| 4,316,133 | 2/1982 | Locke . |
| 4,354,118 | 10/1982 | Spencer . |
| 4,563,628 | 1/1986 | Tietz et al. . |
| 4,670,702 | 6/1987 | Yamada ..................................... 320/21 |
| 4,918,368 | 4/1990 | Baker ........................................ 320/21 |
| 5,057,697 | 10/1991 | Hammond et al. . |
| 5,126,585 | 6/1992 | Boys . |
| 5,422,559 | 6/1995 | Hall ......................................... 320/21 |

Primary Examiner—Kenneth A. Wieder
Assistant Examiner—Jose M. Solis
Attorney, Agent, or Firm—Arthur J. Samodovitz

[57] ABSTRACT

A test circuit for a back-up battery includes a main switch which connects a main power source to a load, and a diode which is interposed between a back-up battery and the load. The diode is reversed biased when the main power source supplies rated power to the load. To test the battery, the main switch is turned off such that the back-up battery supplies operating current to the load via the diode. During a test interval, the output voltage is monitored to determine if the battery is able to supply its rated voltage under load. After the test or if the battery fails to supply requisite voltage, the main switch is turned-on again.

18 Claims, 1 Drawing Sheet

TEST CIRCUIT FOR BACK-UP BATTERY

BACKGROUND OF THE INVENTION

The invention relates generally to power circuits and deals more particularly with circuitry to test a battery which backs-up a main power source.

In critical applications requiring electrical power, a battery may be provided to back-up a main power source in the event that the main power source fails. For such applications it is important to periodically test the battery to ensure that the battery can still provide the rated power if needed. To provide the test, it was known to periodically connect the battery to a dummy load and check that the battery can supply the rated current and voltage for a predetermined time interval. (Then the battery is recharged from the main power source.) However, this approach requires a dummy load and dissipates extra power during the test.

Accordingly, a general object of the present invention is to provide circuitry to test a back-up battery without requiring a dummy load or dissipating extra power during the test.

SUMMARY OF THE INVENTION

The invention resides in the following circuit to test a back-up battery. A main switch connects a main power source to a load, and a diode is interposed between the back-up battery and the load. The diode is reversed biased when the main power source supplies rated power to the load. To test the battery, the main switch is turned off such that the backup battery supplies operating current to the load via the diode. During a test interval, the output voltage is monitored to determine if the battery is able to supply requisite voltage under load. After the test or if the battery fails to supply its rated voltage, the main switch is turned-on again.

DETAILED DESCRIPTION OF THE PREFERRED EMBODIMENT

Figure 1:
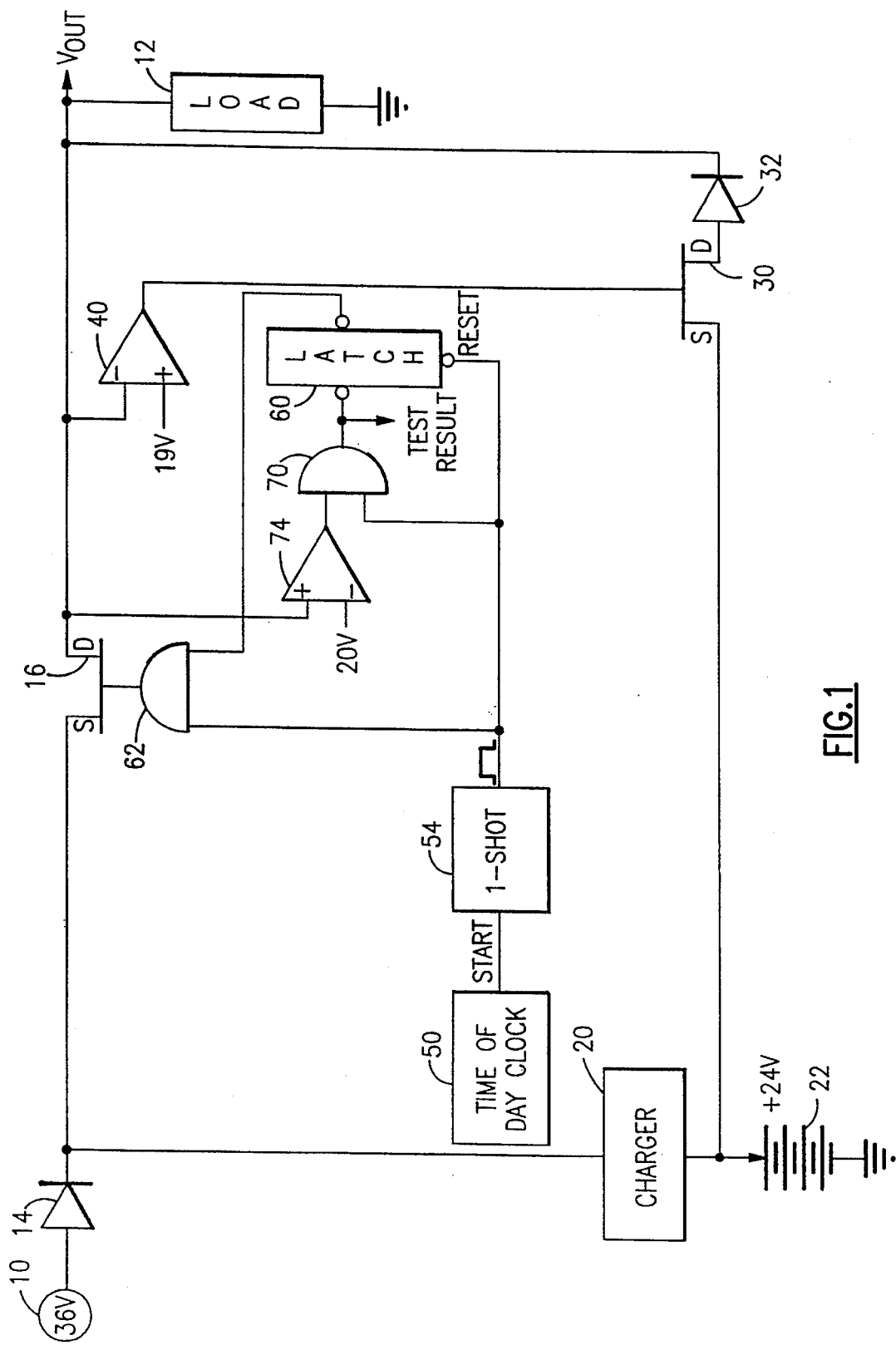
FIG. 1 is a schematic circuit diagram of a main power source, back-up battery and battery test circuit according to the present invention.

FIG. 1 illustrates one embodiment of the present invention. During normal operation, a main DC power source 10 supplies normal operating power to a load 12 via a diode 14 and an FET switch 16 (which is turned on). The power source 10 also drives a charger 20 for a back-up battery 22. By way of example, the power source 10 normally supplies 36 volts and the battery 22 normally supplies 24 volts. In this example, the load (such as a DC/DC converter) can operate satisfactorily with a minimum of 19 volts.

Normally, another FET switch 30, connected to the back-up battery, is also turned on. A diode 32 is connected between switch 30 and the load; however, during normal operation, the diode 32 is reversed biased because the load is supplied with approximately 35 volts from the main DC power source 10 (with a one volt loss in diode 14 and switch 16). If the main power source 10 fails such that the output voltage (Vout) drops below 23 volts, then diode 32 becomes forward biased and the battery 22 supplies the load with approximately 23 volts (the 24 volt battery voltage minus the one volt drop across switch 30 and diode 32). This is the normal battery back-up process.

However, if the failure of main power source 10 is prolonged such that battery 22 discharges to less than 19 volts, then a comparator 40 shuts off switch 30; this prevents damage, i.e. deep discharge, to battery 22. This also ceases all back-up power to the load, but this is not likely worse than the low voltage available at this time from battery 22.

The following describes the circuitry to test the battery 22. Periodically or when requested by an operator, a start test signal is developed. In the former case, this can result from a time of day clock 50. The clock 50 triggers a one-shot 54 which then outputs a positive pulse of predetermined duration, for example, 30 seconds. This pulse enables a latch 60 and turns-off main switch 16 (blocking main power source 10 from delivering current to the load) because both inputs to AND gate 62 are now logic one. The one-shot 54 also supplies a logic one level to AND gate 70 for the duration of the one-shot pulse. If the output voltage remains above 20 volts for the duration of the one-shot pulse, then comparator 74 maintains a logic one level to AND gate 70 for the duration of the one-shot, and the output of the AND gate 70 indicates a favorable test result. However, if the output voltage drops below 20 volts during the duration of the one-shot pulse, then comparator 74 supplies a logic zero to AND gate 70 and the output of the AND gate 70 indicates a test failure. Also in the event of a test failure, AND gate 70 sets the latch 60 to a logic zero which forces AND gate 62 low and thereby turns-on main switch 16. (This is necessary now because the battery cannot supply the requisite power for the remainder of the one-shot pulse.) After the one-shot pulse expires, the AND gate 62 is forced low, even if the test result was favorable, to turn-on main switch 16 (if not already turned-on due to failure of the test). Thus, the battery is tested. In accordance with the object of the present invention, a dummy load was not required and additional power was not dissipated during the test. Rather, the actual load is used for the test during normal operation.

Based on the foregoing, a back-up battery test circuit according to the present invention has been disclosed. However, numerous modifications and substitutions can be made without deviating from the scope of the present invention. For example, power sources and back-up batteries with other voltage levels can be used provided that the main power source voltage is normally greater than the battery back-up voltage. Other types of switches and timers can also be used. Therefore, the present invention has been described by way of illustration and not limitation and reference should be made to the following claims to determine the scope of the present invention.

I claim:

1. A test circuit for a battery which backs-up and has lower rated voltage than a main power source, said circuit comprising:

an input port for connection to the main power source;

an output port for connection to a load;

a main switch connected between the input and output ports;

a battery connection port coupled to said output port; and means for turning off said main switch at a start of a battery test interval, supplying said load from said battery beginning at the start of and continuing during said battery test interval and determining if said battery supplies said load with at least a predetermined threshold voltage for the duration of said battery test interval, in which case said battery passes a test.

2. A circuit as set forth in claim 1 wherein said means for supplying said load from said battery beginning at the start of and continuing during said battery test interval comprises a diode connected between said battery connection port and said output port, said diode being reversed biased when said main power source supplies its rated voltage to said load.

3. A circuit as set forth in claim 2 further comprising a second switch connected in series with said diode between said battery connection port and said output port and means for shutting off said second switch if the load voltage drops below another predetermined threshold voltage less than the first said threshold voltage.

4. A circuit as set forth in claim 1 further comprising means for turning-on said main switch if and when said output voltage drops below said threshold voltage during said test interval.

5. A circuit as set forth in claim 1 further comprising a charger powered by said main power source and connected to supply charging current to said battery via said battery connection port.

6. A circuit as set forth in claim 1 further comprising a diode connected in series with said main switch between said input and output ports and oriented to be forward biased when said main power source supplies its rated voltage to said load.

7. A circuit as set forth in claim 1 further comprising said battery, said battery being connected to said battery connection port.

8. A circuit as set forth in claim 1 wherein the determining means comprises a comparator coupled to compare the load voltage to said predetermined threshold.

9. A circuit as set forth in claim 1 wherein said load is a DC/DC converter.

10. A method for testing a battery which backs-up and has lower rated voltage than a main power source, said method comprising the steps of:

closing a switch and supplying drive current from the main power source to a load via the closed switch during normal operation; and opening said main switch at a start of a battery test interval, supplying drive current from the battery to said load beginning at the start of and continuing during said battery test interval and determining if said battery supplies said load with at least a predetermined threshold voltage for the duration of said battery test interval, in which case said battery passes a capacity test.

11. A method as set forth in claim 10 wherein said battery is coupled to said load via a diode which is reversed biased when said main power source supplies its rated voltage to said load during said normal operation and forward biased during said test interval.

12. A method as set forth in claim 11 further comprising the step of opening a second switch connected in series with said diode between said battery and said load if the load voltage drops below another predetermined threshold voltage less than the first said threshold voltage.

13. A method as set forth in claim 10 further comprising the step of closing said main switch if and when the load voltage drops below said threshold voltage during said test interval.

14. A method as set forth in claim 10 further comprising the step of charging said battery from said main power source.

15. A method as set forth in claim 10 further comprising the step of connecting a diode in series with said main switch between said main power source and said load and orienting said diode to be forward biased when said main power source supplies its rated voltage to said load.

16. A method as set forth in claim 10 wherein the determining step is performed by comparing the load voltage to said predetermined threshold.

17. A method as set forth in claim 10 wherein said battery is interconnected to but does not supply current to said load during said normal operation.

18. A method as set forth in claim 10 wherein said load is a DC/DC converter.

* * * * *